(12) United States Patent
Fiaccabrino et al.

(10) Patent No.: US 8,486,279 B2
(45) Date of Patent: Jul. 16, 2013

(54) SILICON-METAL COMPOSITE MICROMECHANICAL COMPONENT AND METHOD OF MANUFACTURING THE SAME

(75) Inventors: Jean-Charles Fiaccabrino, Grandevent (CH); Marco Verardo, Les Bois (CH); Thierry Conus, Lengnau (CH); Jean-Philippe Thiebaud, Cudrefin (CH); Jean-Bernard Peters, Pieterlen (CH)

(73) Assignee: Nivarox-FAR S.A., Le Locle (CH)

( * ) Notice: Subject to any disclaimer, the term of this patent is extended or adjusted under 35 U.S.C. 154(b) by 433 days.

(21) Appl. No.: 12/743,210

(22) PCT Filed: Nov. 12, 2008

(86) PCT No.: PCT/EP2008/065347
§ 371 (c)(1),
(2), (4) Date: May 14, 2010

(87) PCT Pub. No.: WO2009/062943
PCT Pub. Date: May 22, 2009

(65) Prior Publication Data
US 2010/0243603 A1 Sep. 30, 2010

(30) Foreign Application Priority Data
Nov. 16, 2007 (EP) .................... 07120883

(51) Int. Cl.
*C23F 1/00* (2006.01)
(52) U.S. Cl.
USPC ............................................ 216/2
(58) Field of Classification Search
USPC ............................................ 216/2
See application file for complete search history.

(56) References Cited

U.S. PATENT DOCUMENTS

2002/0055253 A1 * 5/2002 Rudhard .................. 438/672
2007/0103177 A1 5/2007 Chen

OTHER PUBLICATIONS

Perret, Andre et al., "Silicon as material for mechanical wristwatches," Proceedings of the SPIE—The International Society for Optical Engineering SPIE, Int. Opt. Eng USA, vol. 4755, 2002, pp. 645-647.
Kouba J., et al. "SU-8: promising resist for advanced direct LIGA applications for high aspect ratio mechanical microparts," Microsystems Technologies; Micro and Nanosystems Information Storage and Processing Systems, Spring, Berlin, DE, vol. 13, No. 3-4. Jul. 7, 2006, pp. 311-317.
International Search Report issued in corresponding application No. PCT/EP2008/065347, completed Mar. 20, 2009 and mailed Mar. 26, 2009.

* cited by examiner

*Primary Examiner* — Roberts Culbert
(74) *Attorney, Agent, or Firm* — Griffin & Szipl, P.C.

(57) ABSTRACT

The invention relates to a method (1) of manufacturing a silicon-metal composite micromechanical component (51) combining DRIE and LIGA processes. The invention also relates to a micromechanical component (51) including a layer wherein one part (53) is made of silicon and another part (41) of metal so as to form a composite micromechanical component (51). The invention concerns the field of timepiece movements.

12 Claims, 3 Drawing Sheets

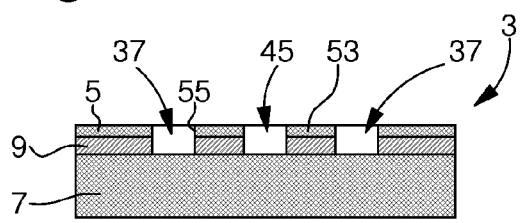
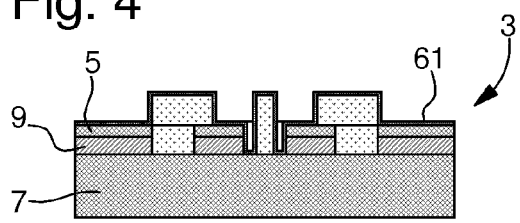
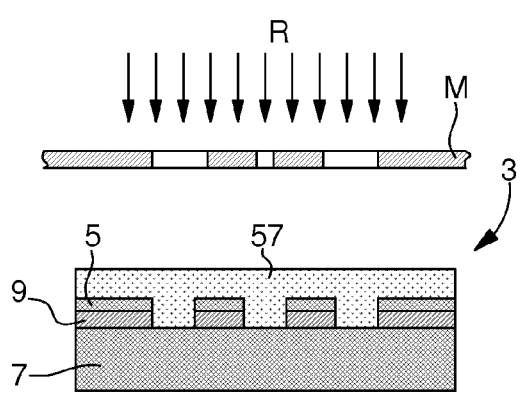
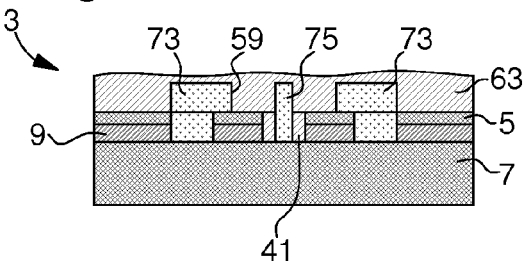
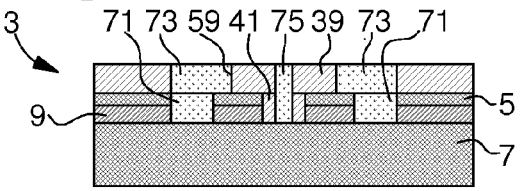
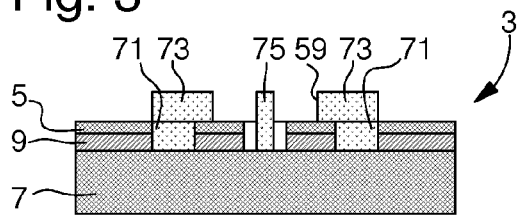
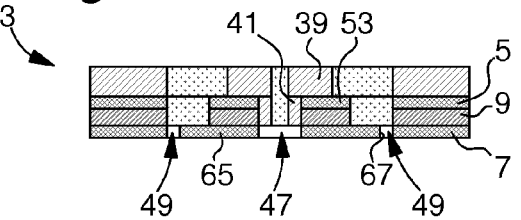

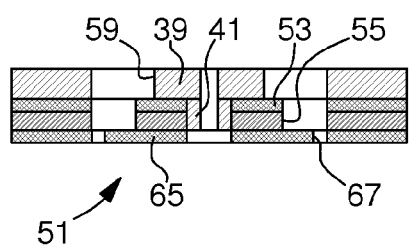
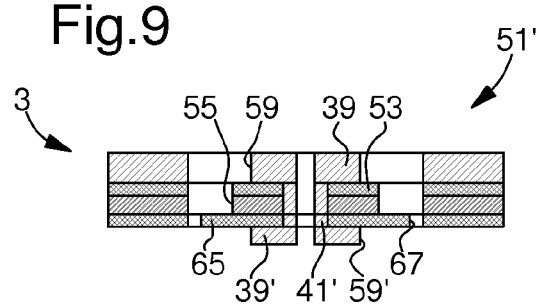
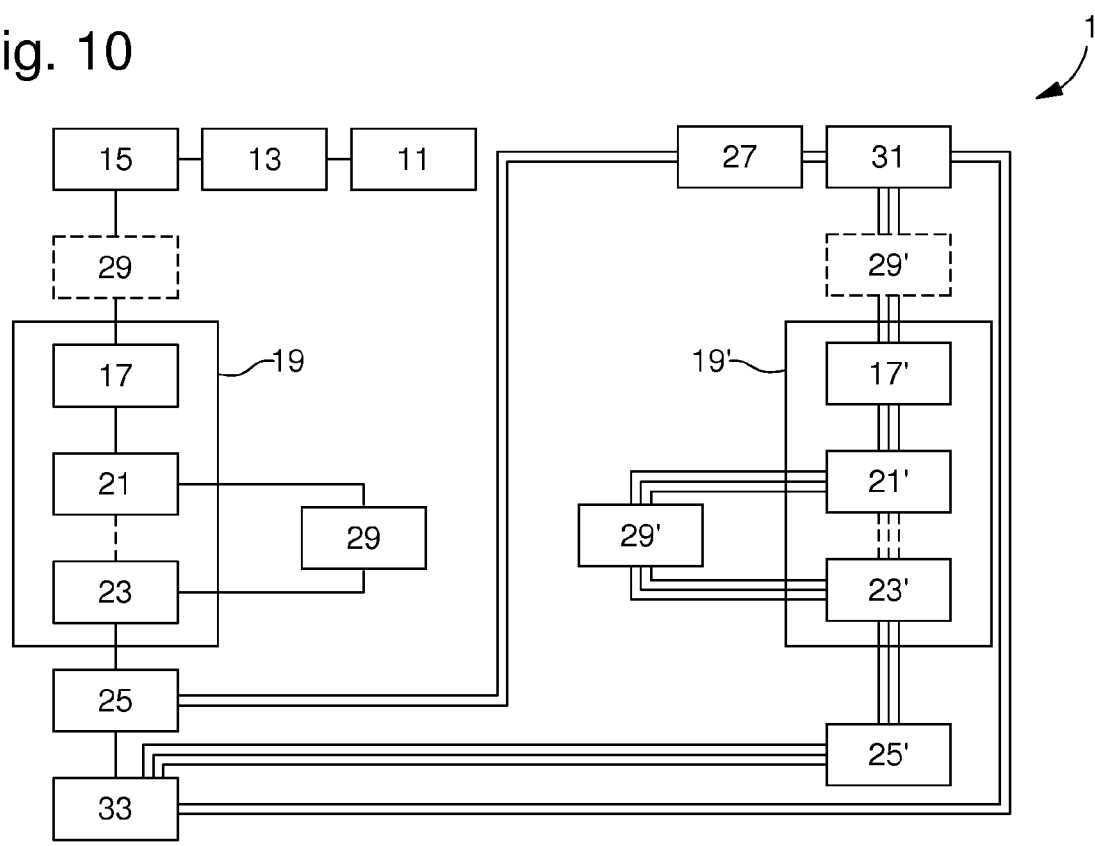

SILICON-METAL COMPOSITE MICROMECHANICAL COMPONENT AND METHOD OF MANUFACTURING THE SAME

This is a National Phase Application in the United States of International Patent Application No. PCT/EP2008/065347 filed Nov. 12, 2008, which claims priority on European Patent Application No. 07120883.9, filed Nov. 16, 2007. The entire disclosures of the above patent applications are hereby incorporated by reference.

FIELD OF THE INVENTION

The invention relates to a silicon-metal composite micromechanical component and a method of manufacturing the same.

BACKGROUND OF THE INVENTION

Silicon is known in tribology for its low friction coefficient. The application of silicon in the field of mechanical watchmaking is advantageous particularly for escape systems and more specifically for the impulse pinions of escape wheels. However, silicon is also known in mechanics for its low plastic deformation zone. The brittle nature of silicon means that it is difficult to adapt to the usual techniques of driving parts onto arbours.

SUMMARY OF THE INVENTION

It is an object of the present invention to overcome all or part of the aforementioned drawbacks by proposing a manufacturing method that can advantageously produce a composite micromechanical component that can be easily adapted to most horological applications.

The invention thus relates to a method of manufacturing a silicon-metal composite micromechanical component including the following steps:
  a) taking a substrate including a top and bottom silicon layer between which an intermediate silicon oxide layer extends,
  b) selectively etching at least one cavity in the top layer to define the pattern of a silicon part of said component;
  c) continuing the etch of said at least one cavity in the intermediate layer;
characterized in that it further includes the following steps:
  d) growing a metal layer from at least one portion of said at least one cavity in order to form a metal part in the thickness of said component in order to insulate the silicon part of said micromechanical component from destructive stress;
  e) releasing the silicon-metal composite micromechanical component from the substrate.

The method advantageously provides a monoblock component, which enjoys the tribological properties of silicon and the mechanical properties of metal.

According to other advantageous features of the invention:
  step d) includes the following steps:
    covering the top of the substrate with photosensitive resin,
    selectively performing photolithography on the photosensitive resin in order to photostructure said resin in accordance with the predetermined pattern of the metal part;
    depositing a metal layer by electroplating, starting from the conductive top surface of the bottom layer, which is vertical to said at least one cavity, and growing therein, from the bottom, the layer between respectively the photostructured resin and the intermediate or top layer for forming the metal part in accordance with said pattern;
  and in that step e) is achieved by removing the photostructured resin.
  said conductive top surface of the bottom layers, which is vertical to said at least one cavity is made conductive by doping the bottom layer and/or by depositing a conductive layer;
  during the photolithography step, the photostructured resin projects from the top layer of the substrate so that the layer can continue to grow by electroplating at least between said projecting portions of the photostructured resin in order to form a second metal part of the micromechanical component above the silicon part;
  the method includes, after step d), a step of machining the top surface of the substrate in order to make the metal layer the same height as the top end of said photostructured resin;
  the metal layer includes nickel;
  the method includes, before the release step, steps of machining and etching at least one cavity in the bottom layer of the substrate to form a second silicon part of the micromechanical component in accordance with a determined thickness and shape;
  the method includes, between the steps of machining and etching the bottom substrate layer and the release step, a step of growing a second metal layer by electroplating in at least one portion of said at least one cavity of the bottom layer in order to form at least one additional metal part in the thickness of the bottom layer;
  the growth step includes the following steps:
    covering the bottom of the substrate with photosensitive resin;
    selectively performing photolithography on the photosensitive resin to photostructure the resin in accordance with the predetermined pattern of the metal part;
    depositing a metal layer by electroplating from the bottom of said at least one cavity by growing, from the bottom, the layer for forming the metal part in accordance with said pattern;
    during the photolithography step the photostructured resin projects from the bottom layer of the substrate so that the layer can continue to grow by electroplating in order to form a second additional metal part of the micromechanical component below the second silicon part;
  prior to the release step, the method includes a step of machining the bottom surface of the substrate in order to make the metal part the same height as the bottom end of said photostructured resin;
  the second electroplated metal layer includes nickel;
  several micromechanical components are produced on the same substrate.

The invention also relates to a silicon-metal composite micromechanical component comprising one part formed in a silicon layer, characterized in that said silicon part includes a toothing for forming a wheel or a pinion and, at least over a portion of the thickness thereof, a metal part with a thickness of more than 6 microns, which insulates the silicon part from destructive stress.

The monoblock component thus enjoys the tribological features of silicon and the mechanical features of metal.

According to other advantageous features of the invention:
the metal part forms a sleeve that covers the peripheral wall of said silicon part;
the metal part forms a sleeve in a cavity made in the silicon part for receiving a pivoting arbour that is driven therein;
each sleeve is connected to the wall of the silicon part by bridges of material;
each metal part includes in the extension thereof a second metal part projecting from the silicon part;
the second metal part includes a toothing for forming a wheel or a pinion;
each metal part includes nickel;
the component comprises a second silicon part formed from a second layer;
the second silicon part includes, at least over one portion of the thickness thereof, an additional metal part for insulating the second silicon part from destructive stress;
the additional metal part forms a sleeve in a cavity made in the second silicon part for receiving a pivoting arbour that is driven therein;
said sleeve is connected to the wall of said cavity by bridges of material;
the additional metal part includes, in the extension thereof, a second additional metal part projecting from the second silicon part;
the second additional metal part includes a toothing for forming a wheel or pinion;
the second silicon part is mounted on the silicon part via an intermediate silicon oxide layer;
the second silicon part includes a toothing for forming a wheel or pinion.

Finally, the invention relates to a timepiece, characterized in that it includes at least one composite micromechanical component in accordance with one of the preceding variants.

BRIEF DESCRIPTION OF THE DRAWINGS

Other features and advantages will appear clearly from the following description, given by way of non-limiting illustration, with reference to the annexed drawings, in which:

FIGS. 1 to 7 are cross-sections of a composite micromechanical component at different phases of the manufacturing method according to the invention;

FIG. 8 is a diagram of a first example of the final step according to the method of the invention;

FIG. 9 is a diagram of a second example of the final step according to the invention;

FIG. 10 is a flow diagram of the manufacturing method according to the invention;

DETAILED DESCRIPTION OF PREFERRED EMBODIMENTS

Figure 11:
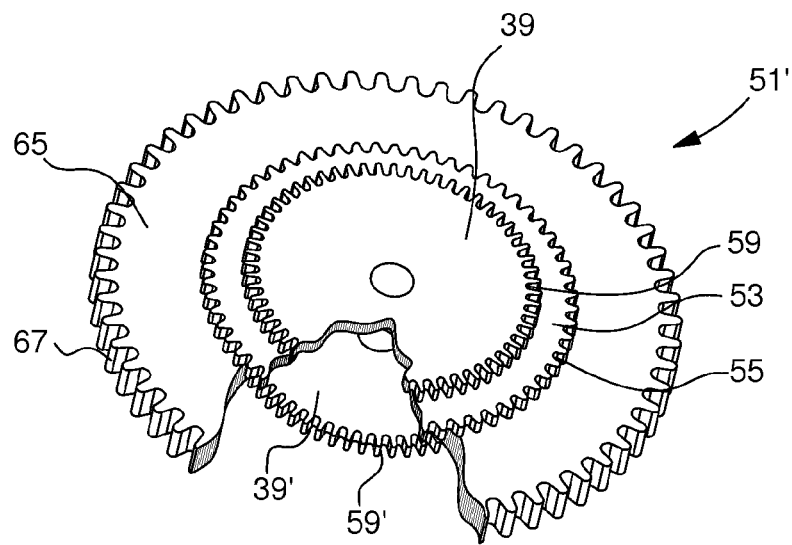
FIG. 11 is a perspective diagram of a gear train according to the invention.

The invention relates to a method of manufacturing 1 a silicon-metal composite micromechanical component 51. As FIGS. 1 to 7 show, method 1 includes a series of steps for forming at least one components 51, 51', 51", 51''', which may be complex and/or made over several layers and/or with several materials. The object of method 1 consists in offering a minimum of one component including at least one silicon part and at least one metal part.

The first step 11 consists in taking a silicon on insulator (SOI) substrate 3. Substrate 3 includes a top layer 5 and a bottom layer 7 made of mono or polycrystalline silicon. An intermediate layer 9, formed of amorphous silicon oxide ($SiO_2$) extends between top and bottom layers 5 and 7.

In step 11, substrate 3 is preferably chosen such that, as seen in FIG. 1, the height of top and intermediate layers 5 and 9 match the final height of one portion 53 of the final micromechanical component 51.

Figure 1B:
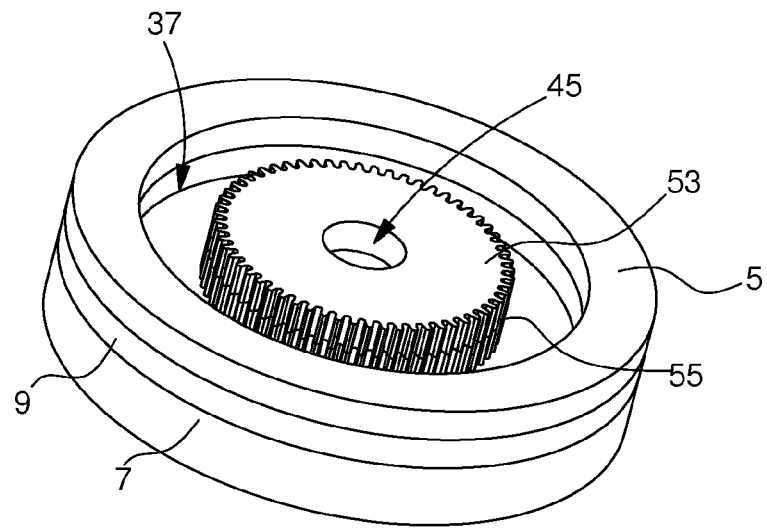
FIG. 1b is a perspective diagram of FIG. 1.

In a second step 13, as FIGS. 1 and 1b show, cavities 37, 45 are selectively etched, for example by a deep reactive ion etching (DRIE) method in top silicon layer 5. These two cavities 37 and 45 form the pattern defining the inner and outer contours of silicon part 53 of micromechanical component 51.

In the example illustrated in FIG. 1, cavity 37 is present on each side of cavity 45, since, as FIG. 1b shows, it is substantially annular and surrounds cavity 45. The proximal wall of cavity 37 is preferably selectively etched to form a toothing 55 on the peripheral edge of portion 53. Cavity 45 is substantially cylindrical with a disk-shaped section and it is coaxial to annular cavity 37.

In a third step 15, wet or dry chemical etching is carried out to extend cavities 37 and 45 in intermediate layer 9, so that part 53 is formed in accordance with the same pattern in intermediate layer 9 until bottom layer 7 is partially exposed.

Method 1 according to the invention then comprises implementation of a LIGA process 19, comprising a series of steps (17, 21 and 23) for electroplating a metal in a particular shape on the top surface of substrate 3 using a photostructured resin.

In a fourth step 17, a layer of photosensitive resin 57 is deposited on the top surface of substrate 3, as shown in FIG. 2. Step 17 can be achieved using a mould casting method. Photosensitive resin 57 is preferably of the Su-8 type, for example the Microchem Corp "Nano™Su-8" product.

In a fifth step 21, photolithography is performed, i.e. an impression is made in said resin by selective exposure to radiation R, using, for example, a partially pierced mask M, as shown in FIG. 2. Next, resin 57 is developed, i.e. all of the portions of resin 57 that have not been exposed to radiation R are removed. The resin thereby photostructured 71, 73 and 75 forms the metal layer, in accordance with the predetermined shape.

In the example of FIG. 3, the photostructured resin includes a bottom ring 71, a top ring 73 and a cylinder 75. In the example of FIG. 3, the shape of bottom ring 71 matches that of cavity 37. Top ring 73 covers bottom ring 71 and partially covers top layer 5 of substrate 3. Finally, the height of cylinder 75 is substantially equivalent to the thickness of the stack of rings 71 and 73, and the cylinder is centred in cavity 45. In the example illustrated in FIGS. 1 to 7, the inner diameter of top ring 73 includes a toothing 59.

In a sixth step 29, a conductive anchoring layer 61 is preferably deposited on the top surface of substrate 3, as shown in FIG. 4. This step may be achieved, for example, via a conventional metallizing method using vacuum cathodic sputtering. Preferably, layer 61 includes gold, i.e. pure gold or a gold alloy. The thickness of layer 61 can be comprised between 10 and 100 nm.

In a seventh step 23, the start of a metal layer is made by electroplating the top surface of substrate 3, i.e. a metal layer 63 is grown to form at least one metal part 41 on micromechanical component 51. In the example illustrated in FIG. 5, layer 63 starts substantially on the top surface of bottom layer 7 exposed by cavity 45.

The presence of photostructured resin cylinder 75 forces the metal layer 63 to grow in successive annular rings between cylinder 75 and intermediate layer 9, then between cylinder 75 and top layer 5 of substrate 3. This first electroplating phase forms a first metal part 41 in at least one portion of cavity 45.

It is thus clear from this first phase 23 that micromechanical component 51 is now formed on a layer that includes a silicon and silicon oxide portion 53 wherein at least one portion of one of cavities 45 includes a metal part 41.

In the example illustrated in FIG. 5, the electroplating is continued, forming layers not in cavity 45, but above and also on one part of top layer 5 of substrate 3. The successive layers are then formed exclusively between top ring 73 and photostructured resin cylinder 75. It is thus clear that the layer 39 formed in the second phase is substantially annular in shape and that the external diameter of said layer includes a toothing that is the reverse of toothing 59 of photostructured resin top ring 73. At the end of step 23, it may happen that a metal layer 63 is obtained over the entire top surface of substrate 3, as seen in FIG. 5.

Layer 63, i.e. particularly metal parts 39 and 41 preferably include nickel, i.e. nickel or a nickel alloy. The potential difference of substrate 3 necessary at electroplating step 23 is preferably achieved via contact on the bottom and/or top surface thereof.

In an eighth step 25, the top surface of substrate 3 is machined, for example by lapping, so as to make the height of metal part 39, obtained during said second phase of step 23, level with the thickness of top ring 73 and cylinder 75 in the photostructured resin, as shown in FIG. 6. This allows the second metal part 39 that includes the reverse toothing (hereafter referenced 59) to be delimited correctly.

It is thus clear, at this step 25, that micromechanical component 51 is now formed over two layers. The first layer includes a silicon and silicon oxide part 53 wherein at least one portion of one of cavities 45 includes a metal part 41. The second layer formed above the first comprises a second metal part 39.

In the ninth and tenth steps 27 and 31, as illustrated by the double lines in FIG. 10, a second silicon part 65 is formed in bottom layer 7 of substrate 3. During step 27, the bottom surface of substrate 3 is machined to reduce the thickness thereof to the value of the desired final bottom layer 7. During step 31, cavities 47, 49 are etched, for example by a DRIE method, in bottom silicon layer 7. As in steps 13 and 15, these two cavities 47 and 49 form the pattern defining the contour of second silicon part 65 of micromechanical component 51.

In the example illustrated in FIG. 7, cavity 49 is present on both sides of cavity 47, since it is substantially annular and surrounds cavity 47. The proximal wall of cavity 49 is preferably etched selectively to form a toothing 67 on the peripheral edge of second portion 65. Cavity 47 is substantially cylindrical with a disk-shaped section and it is coaxial to annular cavity 49.

There is no preferred sequence for steps 27 to 31 and these steps can therefore occur in any order. Machining step 27 preferably consists of mechanochemical polishing such as lapping by chemical abrasion.

It is thus clear that, after steps 27 and 31, micromechanical component 51 is now formed over three layers. The first layer includes one silicon and silicon oxide part 53 wherein at least one portion of one of cavities 45 includes a metal part 41. The second layer above the first is formed by a second metal part 39. The third layer below the first is formed by a second silicon part 65.

Method 1 according to the invention then includes, as illustrated by the triple lines in FIG. 10, implementation of a new LIGA process 19' comprising a series of steps (17', 21' and 23') for electroplating a metal in a particular shape on the bottom surface of substrate 3 using a photostructured resin.

In an eleventh step 17', a layer of photosensitive resin is deposited on the bottom surface of substrate 3, for example using a mould casting method. In a twelfth step 21', photolithography is performed to make the growth pattern for the future metal electroplating.

In a thirteenth step 29' an anchoring layer is preferably deposited on substrate 3. This step can be achieved, for example, by vacuum deposition, as mentioned above, of a pure gold or gold alloy layer.

In a fourteenth step 23', a metal layer is electroplated on the bottom surface of substrate 3 to form at least one additional metal part 41' of micromechanical component 51 in at least one portion of cavity 47.

It is thus clear at this stage that micromechanical component 51 is still formed over three layers. The first layer includes a silicon and silicon oxide part 53 wherein at least one portion of one of cavities 45 includes a metal part 41. The second layer above the first is formed by a second metal part 39. The third layer below the first is formed by a second silicon part 65 wherein at least one portion of one of cavities 47 includes an additional metal part 41'.

Electroplating step 23' can be continued to form layers that are not in cavity 47 but below it and, possibly, over part of the bottom surface 7 of substrate 3. The successive layers are then formed exclusively between the resin, photostructured during step 21', in a second additional metal part 39'.

The electroplated metal layer, i.e. the additional metal parts 39' and 41' preferably include nickel, i.e. pure nickel or a nickel alloy.

In a fifteenth step 25', the bottom surface of substrate 3 is machined, for example by lapping, so as to delimit the second additional metal part 39' correctly. In a similar manner to second portion 39, second additional metal part 39' can also include a toothing 59'.

It is thus clear at this stage that micromechanical component 51 is now formed over four layers. The first layer includes a silicon and silicon oxide part 53 wherein at least one portion of one of cavities 45 includes a metal part 41. The second layer above the first is formed by a second metal part 39. The third layer below the first is formed by a second silicon part 65 wherein at least one portion of one of cavities 47 includes an additional metal part 41'. The fourth layer below the third is formed by a second additional metal layer 39'.

Of course, the advantage of this method is that it also advantageously allows several micromechanical components 51 to be made on the same substrate 3. Moreover, with the help of the above explanation and the single, double and triple lines in FIG. 10, it should be understood that method 1 does not have to be not carried out in its entirety, i.e. depending upon the complexity of the micromechanical component 51 to be manufactured, the component may be completely constructed, for example, after step 25, 31 or 25'. However, for every construction variant, method 1 includes a last step 33 that consists in releasing micromechanical component 51 from substrate 3. By way of example, several embodiments of method 1 and/or micromechanical component 51 are explained below.

Figure 12:
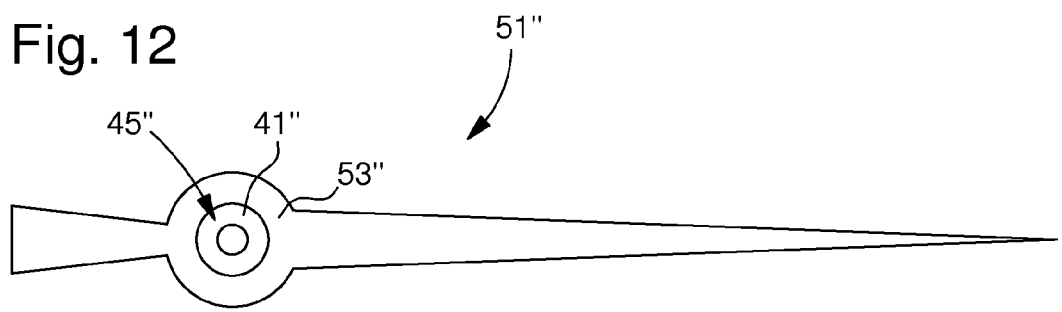
FIG. 12 is a top view of a hand obtained in accordance with the invention.

In a first embodiment, release step 33 of method 1 occurs after step 25 of constructing metal part 41 in the silicon part 53 as represented by single lines in FIG. 10. Release step 33 then consists in removing photostructured resin and bottom layer 7 or bottom and intermediate layers 7 and 9. The micromechanical component 51" thereby manufactured is free relative to the rest of substrate 3. The component includes, as shown in FIG. 12, over a single layer including a silicon or silicon and silicon oxide part 53" shaping the body of a hand wherein at least one portion of one of cavities 45" has a metal part 41" forming a sleeve. In a second embodiment illustrated in FIG. 8, it is clear that, for example, release step 33 of method 1 is performed after step 31 of constructing the second silicon part 65 as represented by the double lines in FIG. 10. Release step 33 then consists in removing photostructured resin parts 71, 73 and 75 for example by means of etching and/or stripping. The micromechanical component 51 thereby manufactured is free relative to the rest of substrate 3. It therefore includes, over three stacked layers, a second metal part 39, a silicon and silicon oxide part 53 wherein at least one portion of one of cavities 45 includes a metal part 41 and a second silicon part 65.

The micromechanical component 51 obtained in accordance with the second embodiment of method 1 explained above and with reference to FIGS. 1 to 8 and 10 substantially comprises a consecutive stack of three wheel parts respectively 39, 53 and 65 including a toothing 59, 55 and 67. This component 51 is preferably adapted to form an escape wheel for cooperating with a coaxial escape pallet. Silicon toothings 55 and 67 are then advantageously used for forming impulse toothings for cooperating with the pallet stones of said pallet. Metal toothing 59 is thus used as an escape pinion for regulating the timepiece movement to which micromechanical component 51 belongs.

In a third embodiment illustrated in FIG. 9, it can be seen, for example, that release step 33 of method 1 occurs after step 25' of constructing the second additional metal part 39' represented by the triple lines in FIG. 10. Release step 33 then consists in removing not only photostructured resin parts 71, 73 and 75 from across the top part of substrate 3, but also those present on the bottom layer of said substrate. The micromechanical component 51' thereby manufactured is free relative to the rest of substrate 3.

Micromechanical component 51' thus includes, as shown in FIG. 11, over four stacked layers, a second metal part 39, a silicon and silicon oxide part 53 wherein at least one portion of one of cavities 45 includes a metal part 41, a second silicon part 65 wherein at least one portion of one of cavities 47 includes an additional metal part 41' and a second additional metal part 39'.

The micromechanical component 51' obtained in accordance with the third embodiment of method 1 explained above and with reference to FIGS. 1 to 7 and 9 to 11 substantially comprises a consecutive stack of four wheel layers respectively 39, 53, 65 and 39' including a toothing 59, 55, 67 and 59.

In all of these embodiments, micromechanical components 51, 51', 51" are advantageously driven not directly onto a silicon part 53 and 65, but onto metal parts 39, 39', 41 and 41'. The thickness of metal part 41 is more than 6 microns, in order, preferably, for metal part 41 to sufficiently insulate silicon part 53. In fact, beyond this thickness and ideally starting from 10 microns, a metal, such as for example nickel, is capable of absorbing stress elastically or plastically without passing it onto the silicon.

It should be understood upon reading the above explanation that micromechanical components 51, 51', 51" of the Figures are simply example embodiments, which demonstrate that method 1 can form a stack of up to four layers (two comprising metal and two comprising silicon and metal) without any excessive complications. The configuration of the first embodiment could thus constitute the simplest micromechanical component and the third embodiment a highly complex component.

In a variant represented in dotted lines in FIG. 10, step 29, occurring between steps 21 and 23, and consisting in depositing anchoring layer 61, could be moved to between steps 15 and 17, i.e. between the etch of intermediate layer 9 and deposition of the photosensitive resin layer 57. In this first variant, the two silicon layers 5 and 7 will preferably be doped.

Of course, the present invention is not limited to the example illustrated, but could be subject to various variants and alterations which will be clear to those skilled in the art. In particular, other metal layers 63 could be envisaged, for example gold, aluminium, chromium or any of their alloys. Likewise, other anchoring layers 61 could be envisaged if they are conductive and adhere perfectly to the metal selected for the galvanic growth layer 63. However, it should be noted that step 29 of depositing layer 61 is not essential for galvanic growth to take place properly if both silicon layers 5 and 7 are doped.

Likewise, patterns that are different from toothings 55, 59, 59' and 67 could be etched, such as hooks or clicks. It should also be noted that layer 63 could be made against said etched patterns such as toothings 55, 59, 59' and 67 for example.

Likewise, the photolithography could, of course, form a negative or positive structure depending upon the photostructured resin employed or the application envisaged. A spray coating method could also deposit resin layer 57.

Finally, metal layer 63 could equally well be made on an inner wall portion of a cavity 45 as on the peripheral wall of at least one of silicon parts 53 and 65. Layer 63 could also be structured such that it is connected to said silicon wall via bridges of material.

The invention claimed is:
1. A method of manufacturing a silicon-metal composite micromechanical component, the method including the following steps:
   a) providing a substrate including a top silicon layer and a bottom silicon layer, between which an intermediate silicon oxide layer extends,
   b) selectively etching at least one cavity in the top layer to define the pattern of a silicon part of the component;
   c) continuing the etch of the at least one cavity in the intermediate layer;
   d) growing a metal layer at least from one portion of the at least one cavity in order to form a metal part in the thickness of the component that insulates the silicon part of the micromechanical component from destructive stress, wherein step d) includes the following additional steps
      (i) covering the top of the substrate with photosensitive resin;
      (ii) selectively performing photolithography on the photosensitive resin to photostructure the resin in accordance with the predetermined pattern of the metal part;
      (iii) depositing a metal layer by electroplating, starting from the top conductive surface of the bottom silicon layer, wherein the top conductive surface of the bottom silicon layer is vertical to the at least one cavity, and wherein the metal layer is deposited by growing, from the top conductive surface of the bottom silicon layer, the layer between, respectively, the photostructured resin and the intermediate layer or the top layer, for forming the metal part in accordance with the pattern; and e) releasing the silicon-metal composite micromechanical component from the substrate, wherein the micromechanical component is released by removing the photostructured resin.

2. The method according to claim 1, wherein the top conductive surface of the bottom layer, which is vertical to the at least once cavity is made conductive by doping the bottom layer and/or by the deposition of a conductive layer.

3. The method according to claim 1, wherein, during photolithography step, the photostructured resin projects from the top layer of the substrate so that the layer can continue to grow by electroplating at least between the projecting portions of the photostructured resin in order to form a second metal part of the micromechanical component above the silicon part.

4. The method according to claim 1, wherein, after step d), it includes a step of machining the top surface of the substrate so as to level the metal layer to the same height as the top end of the photostructured resin.

5. The method according to claim 1, wherein the metal layer includes nickel.

6. The method according to claim 1, wherein, before the release step, it includes steps of machining and etching at least one cavity in the bottom layer of the substrate to form a second silicon part in the micromechanical component in accordance with a determined shape and thickness.

7. The method according to claim 6, wherein, between the steps of machining and etching the bottom layer of the substrate, it includes a release step, a step of growing a second metal layer by electroplating in at least one portion of the at least one cavity of the bottom layer so as to form at least one additional metal part in the thickness of the bottom layer.

8. The method according to claim 7, wherein the second electroplated metal layer includes nickel.

9. The method according to claim 7, wherein the growth step includes the following steps:
 (i) covering the bottom of the substrate with photosensitive resin;
 (ii) selectively performing photolithography on the photosensitive resin in order to photostructure the resin in accordance with the predetermined pattern of the metal part;
 (iii) depositing a metal layer by electroplating starting from the bottom of the at least one cavity, by growing therein, from the bottom, the layer for forming the metal part in accordance with the pattern.

10. The method according to claim 9, wherein, during the photolithography step, the photostructured resin projects from the bottom layer of the substrate so that the layer can continue to grow by electroplating in order to form a second additional metal part of the micromechanical component below the second silicon part.

11. The method according to claim 1, wherein, before the release step, it includes a step of machining the bottom surface of the substrate in order to level the metal part to the same height as the bottom end of the photostructured resin.

12. The method according to claim 1, wherein several micromechanical components are manufactured in the same substrate.

* * * * *